(12) United States Patent
Arslain et al.

(10) Patent No.: US 6,366,153 B1
(45) Date of Patent: Apr. 2, 2002

(54) THERMAL MANAGEMENT OF AN ELECTRONIC SWITCH

(75) Inventors: David Robert Arslain; Richard Joseph Ravas, Jr.; Ashraf Kamal Kamel, all of Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/567,527

(22) Filed: May 9, 2000

(51) Int. Cl.⁷ ............................................. H01L 35/00
(52) U.S. Cl. ...................... 327/512; 327/378
(58) Field of Search ............................ 327/512, 513, 327/317, 318, 362, 363, 83, 138, 262, 378, 538, 170

(56) References Cited

U.S. PATENT DOCUMENTS

| | | | | |
|---|---|---|---|---|
| 4,689,543 A | * | 8/1987 | Hucker | 318/798 |
| 4,924,112 A | * | 5/1990 | Anderson et al. | 361/103 |
| 5,086,212 A | * | 2/1992 | Itakura et al. | 361/90 |
| 5,379,230 A | * | 1/1995 | Morikawa | 327/512 |
| 5,690,849 A | * | 11/1997 | De Vilbiss et al. | 219/497 |
| 5,708,351 A | * | 1/1998 | Takamoro | 323/282 |
| 5,875,965 A | * | 3/1999 | Lee | 361/695 |

* cited by examiner

Primary Examiner—Terry D. Cunningham
Assistant Examiner—Paul Dinh
(74) Attorney, Agent, or Firm—Jimmy L. Funke

(57) ABSTRACT

Thermal management of an electronic switch, that provides power to a load, is achieved by monitoring a switch temperature of the electronic switch. When the switch temperature exceeds a first set temperature, the control signal is modified such that an average power dissipated by the electronic switch is reduced. In one embodiment, the control signal is modified by increasing a slew rate of the control signal when the switch temperature exceeds the first set temperature. In another embodiment, a frequency of the control signal is reduced when the switch temperature exceeds the first set temperature.

4 Claims, 2 Drawing Sheets

THERMAL MANAGEMENT OF AN ELECTRONIC SWITCH

TECHNICAL FIELD

The present invention is directed to thermal management, and more specifically to thermal management of an electronic switch.

BACKGROUND OF THE INVENTION

In many systems, the power dissipation of a given electronic switch (e.g., a field effect transistor (FET)) is set during manufacture. For example, in many systems, a slew rate of a control signal is selected based on a desire to reduce electromagnetic emissions from the electronic switch so as to decrease the noise radiated to other circuitry in the system. Unfortunately, in many applications, reducing a slew rate of the control signal can cause the switch to dissipate excessive power during switching. This is undesirable in that excessive power dissipation can produce switch semiconductor junction temperatures that exceed the rated maximum switch temperature, which can lead to a breakdown of a switch semiconductor junction and ultimately to the destruction of the switch.

In systems that utilize pulse width modulated (PWM) control signals (e.g., systems that include variable assist electromagnets for power steering), the frequency of a PWM current (delivered to a load) must be high enough that audible noise is not excessive. However, utilizing higher frequency control signals can also cause an electronic switch to dissipate excessive power. As above, excessive power dissipation in the switch can lead to breakdown of the semiconductor junctions of the switch, and ultimately to destruction of the switch.

Traditionally, the junction temperature of electronic switches has been controlled through appropriate heat sinking and by selecting an electronic switch that has a junction area that can withstand an expected worse case power dissipation. However, both heat sinking and utilizing switches with larger die areas adds additional cost to a given system.

As such, a technique which thermally manages an electronic switch, thus allowing electronic switches with reduced semiconductor die area to be utilized and decreasing the need for heat sinks, is desirable.

SUMMARY OF THE INVENTION

The present invention is directed to a technique for thermal management of an electronic switch that provides power to a load responsive to a pulse width modulated control signal. A switch temperature of the electronic switch is monitored to determine whether the switch temperature is below a first set temperature. When the switch temperature exceeds the first set temperature, the control signal is modified such that an average power dissipated by the electronic switch is reduced. Preferably, the control signal is restored to its original state when the switch temperature no longer exceeds the first set temperature. In one embodiment, the control signal is modified by increasing a slew rate of the control signal when the switch temperature exceeds the first set temperature. In another embodiment, a frequency of the control signal is reduced when the switch temperature exceeds the first set temperature.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

The present invention is directed to a thermal management technique for a silicon-based electronic switch that provides a drive current to an inductive load such as a variable effort steering (VES) actuator, an electronic variable orifice (EVO) solenoid, or a proportional antilock braking system (ABS) solenoid. The power dissipated by an electronic switch is generally directly proportional to temperature of the switch. Thus, according to an embodiment of the present invention, the temperature of an electronic switch is continuously monitored such that, when the temperature exceeds a first set temperature, corrective action is taken to reduce the power dissipated by the switch. The switch temperature (i.e., power dissipated by the switch) is lowered by lowering the frequency and/or increasing the slew rate of the PWM control signal. When the excessive power dissipation has subsided (as indicated by the switch temperature being reduced below the first set temperature for a desired amount of time (e.g., five seconds)), the electronic switch resumes normal operation. One of ordinary skill in the art will appreciate that the amount of time that the switch is maintained in a lower power mode is application dependent.

Figure 1:
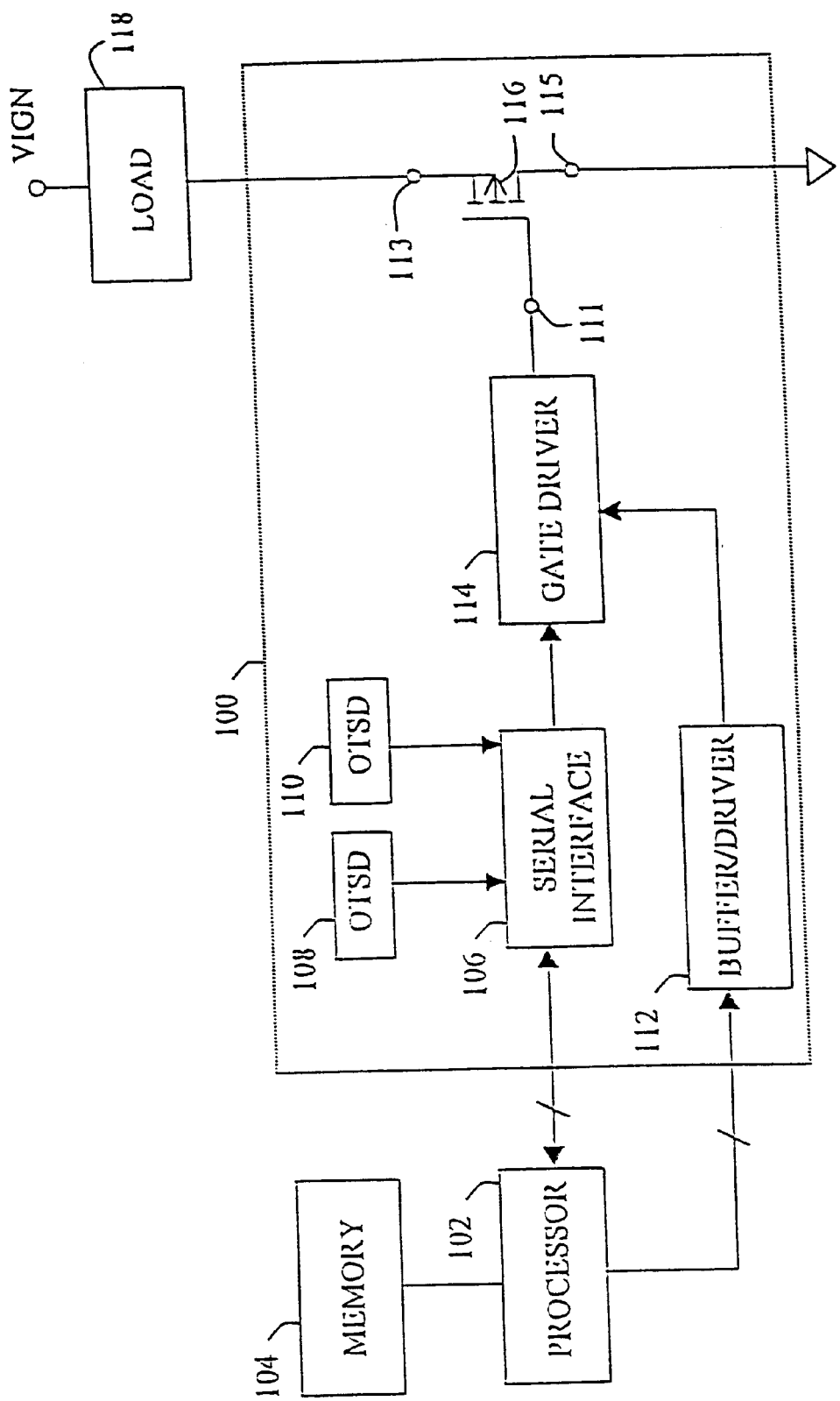
FIG. 1 is an electrical schematic in block diagram form of an electronic switch and control system therefor, according to an embodiment of the present invention.

FIG. 1 depicts an electrical schematic, in block diagram form, of a programmable driver 100 that is coupled to a processor 102 and one side of a load 118, according to an embodiment of the present invention. The other side of load 118 is coupled to a voltage source (VIGN) that is provided by the vehicle battery, via the ignition of the vehicle. In this context, the term processor may include a general purpose processor, a microcontroller (i.e., an execution unit with memory, etc., integrated within a single integrated circuit) or a digital signal processor. Processor 102 is also coupled to a memory subsystem 104, which stores various routines for providing PWM control signals to FET 116 (through buffer/driver 112 and gate driver 114) and determining the status of driver 100, among others. Driver 100 provides drive current to load 118 (e.g., a variable assist electromagnet utilized in a vehicle power steering subsystem) in response to PWM control signals provided by processor 102.

Processor 102 is also coupled to driver 100 through a serial interface 106. Processor 102 controls, in part, and tracks the status of driver 100 through serial interface 106. Serial interface 106 is preferably implemented as a serial peripheral interface (SPI) slave that includes circuitry which receives serial clock (SCLK), serial data in (SDI) and chip select (CS) signals and provides serial data out (SDO) signals. Serial interface 106 includes a number of control registers and status registers (not shown) that are utilized for communication with processor 102. Circuitry for implementing a SPI slave is well known to one of ordinary skill in the art and, as such, is not further discussed herein.

Programmable driver 100 also includes an over temperature sensing device (OTSD) 108 and an OTSD 110, which are preferably incorporated in a monolithic integrated circuit together with serial interface 106, gate driver 114, buffer/driver 112 and FET 116. Such temperature sensing devices are well known to one of ordinary skill in the art and, as such, are not further discussed herein. OTSD (e.g., temperature sensor) 108 monitors the junction temperature of FET 116 and, when the junction temperature exceeds a first set temperature, (e.g., 140° C.) causes a first temperature register (not shown), included within the control register of serial interface 106, to be set.

Periodically, processor 102 reads the first temperature register, among others, and (based upon the value of the first temperature register) commands an appropriate action. When processor 102 determines that the first temperature register is set, processor 102 writes to one of the fault registers (i.e., a high temperature fault register) within interface 106. The high temperature fault register, when set, causes a second current source (not shown), within gate driver 114, to be enabled. Enabling the second current source causes the slew rate of the PWM control signal, provided to a gate 111 of FET 116, to be increased as is further discussed below. Current source design is well know to one of ordinary skill in the art and, as such, is not further discussed herein.

Gate driver 114 preferably includes two current sources (a first current source (not shown) and the second current source, mentioned above). As discussed above, the availability of the second current source to provide current, to the gate 111 of FET 116, is determined by the contents of the first temperature register. That is, when the first temperature register is set, the second current source is later enabled such that it provides current, to gate 111 of FET 116, as dictated by processor 102 (i.e., the PWM control signal). One of ordinary skill in the art will appreciate that the output of OTSD 108 could be directly coupled to processor 102 and that processor 102 could be directly coupled to and thus directly control the second current source, if desired. Further, one of ordinary skill in the art will appreciate that the output of OTSD 108 could be coupled directly to and thus directly enable the second current source.

Preferably, the first current source and the second current source provide an approximately equal amount of current. In preferred embodiments, the first current source provides a current that causes a control signal with a slew rate of 0.5 V/uS or 1.0 V/uS to be provided at gate 111 of FET 116, as dictated by the PWM control signal from processor 102. The second current source, when enabled, provides a current that causes a control signal with a slew rate of 1.0 V/uS or 2.0 V/uS (in combination with the current provided by the first current source) to be provided at gate 111 of FET 116, as dictated by the PWM control signal from processor 102. One of ordinary skill in the art will appreciate that the first current source and the second current source could provide different amounts of current, if desired.

As mentioned above, processor 102 is programmed to provide a pulse width modulated (PWM) control signal to gate driver 114 through buffer/driver 112. When implemented in an automotive vehicle as a brake system (i.e., automotive system) controller, processor 102 may modify the PWM control signal in response to detecting that the brakes of the vehicle have been applied. Whatever the reason, when processor 102 provides a PWM signal to buffer/driver 112, gate driver 114 provides a control signal to gate 111 of FET 116 (i.e., an automotive electronic switch), which in turn provides a load current to load 118.

Figure 2:
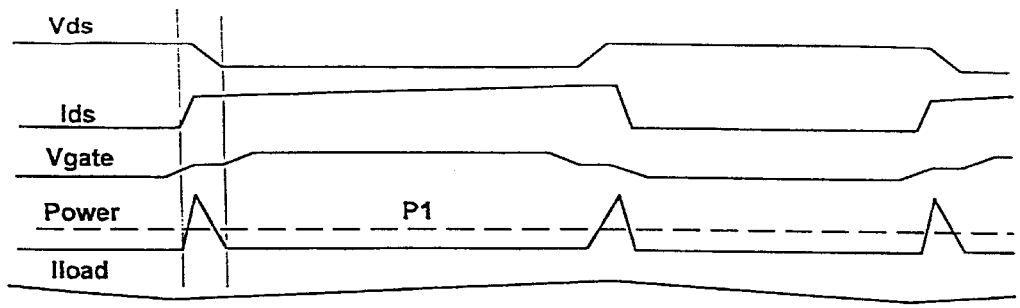
FIG. 2 is an electrical signal diagram of various exemplary reference waveforms associated with an electronic switch (e.g., FET)

As discussed above, the level of the signal provided, to gate 111 of FET 116, is dictated by whether only the first current source is enabled or if both the first and second current sources are enabled. Increasing the slew rate of the control signal, at gate 111 of FET 116, causes the switching time (i.e., the rise and fall times) of FET 116 to decrease, which decreases the average power dissipated by FET 116 (see FIG. 3). As shown by contrasting the reference waveforms of FIG. 2 with the waveforms of FIG. 3, doubling the slew rate (in FIG. 3) reduces the switching times by about one-half, which reduces the average power dissipated by the switch by about one-half. As mentioned above, gate driver 114 can automatically respond to the tripping of OTSD 108 or serial interface 106 can be configured such that processor 102 is required to initiate the enablement of the second current source, located within gate driver 114.

Figure 4:
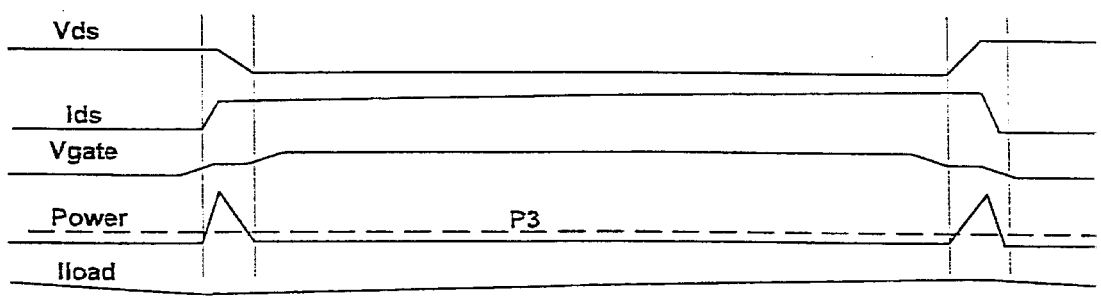
FIG. 4 is an electrical signal diagram of various exemplary waveforms associated with the switch of FIG. 1 when the frequency of the PWM control signal (Vgate) is decreased.

As an alternative to, or in combination with, increasing the slew rate of the control signal to gate 111 of FET 116, the frequency of the control signal can be reduced. According to this embodiment, if the junction temperature of FET 116 is not reduced below the first set temperature within a first time period, processor 102 preferably reduces the frequency of the PWM control signal provided to the gate driver 114 (through buffer/driver 112), in addition to, or as an alternative for, increasing the slew rate of the control signal. Signals associated with FET 116, when the frequency is reduced by one-half, (as compared to those of FIG. 2) are shown in FIG. 4. Reducing the frequency of the control signal by about one-half, reduces the average power dissipated by the switch by about one-half. If after reducing the frequency by about one-half, OTSD 108 still indicates that the junction temperature of FET 116 is above a desired level, processor 102 may reduce the pulse width of the PWM control signal after a second time period.

Similar to OTSD 108, OTSD 110 also monitors the junction temperature of FET 116 and when the junction temperature exceeds a second set temperature (e.g., 160° C.), that is higher than the first set temperature, provides a control signal which causes gate driver 114 to be disabled while OTSD 110 is set. Alternatively, a second temperature register (not shown), included within serial interface 106, is set. The setting of the second temperature register is communicated to processor 102, which preferably responds by discontinuing the PWM control signal while OTSD 110 is set.

Figure 3:
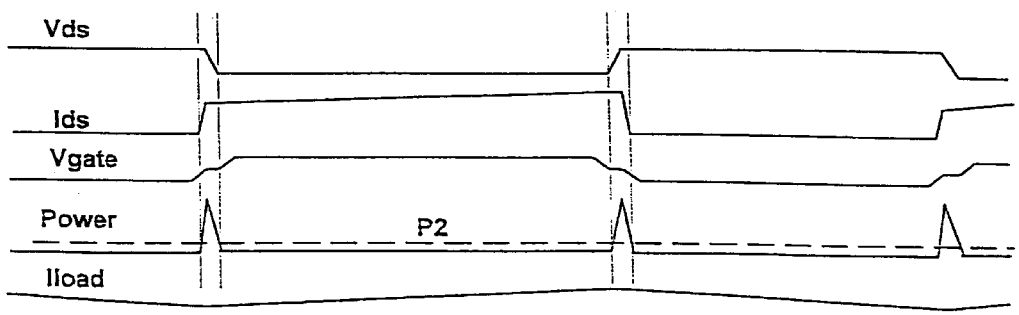
FIG. 3 is an electrical signal diagram of various exemplary waveforms associated with the switch of FIG. 1 when the slew rate of a PWM control signal (Vgate) is increased.

As briefly described above, FIG. 2 depicts various exemplary reference waveforms (i.e., Vds (drain-to-source voltage), Ids (drain-to-source current), Vgate (gate voltage), power (P1; dissipated by FET 116) and Iload (current at load 118)) associated with FET 116 when driven by a reference control signal (i.e., Vgate). FIG. 3 shows exemplary waveforms associated with FET 116 when the slew rate of the control signal is doubled, according to one embodiment, as compared to FIG. 2. FIG. 4 shows exemplary waveforms associated with FET 116, when the frequency of the control signal is reduced by one-half, according to another embodiment, as compared to FIG. 2. In both FIGS. 3 and 4, the average power dissipated by FET 116 (P2 and P3) is approximately one-half the average power (P1) dissipated by FET 116 in conjunction with the reference control signal of FIG. 2. Preferably, the PWM control signal is adjustable from 0–5 kHz.

In summary, a technique has been described herein, which monitors the junction temperature of an electronic switch, that provides power to a load (e.g., an inductive load). As described above, thermal management of the electronic switch is achieved through a sensed temperature feedback and corresponding adjustment of the PWM control signal slew rate, frequency and/or pulse width. As such, a cost effective system is achieved that under normal operation does not compromise radiated emission performance and/or mechanical system noise performance. Performance of the system, described herein, is only adversely affected while a high temperature condition exists. When thermal relief is achieved and the electronic switch no longer reports a high junction temperature message, processor 102 preferable returns the PWM control signal to its normal slew rate, frequency and/or pulse width. If at a later time, driver 100 reports that the switch junction temperature is exceeding a desired maximum temperature, processor 102 again implements thermal management of the electronic switch.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

What is claimed is:

1. A thermally managed system for controlling the application of electric power to a load, comprising:

an electronic switch;

a temperature sensor thermally coupled to the electronic switch to provide an indication of a switch temperature of the electronic switch;

means for providing a pulse width modulated control signal to the electronic switch so as to control power provided therefrom to the load;

means for monitoring the switch temperature of the electronic switch to determine whether the switch temperature exceeds a first set temperature; and means for increasing a slew rate of the control signal such that an average power dissipated by the electronic switch is reduced when the switch temperature exceeds the first set temperature.

2. The system of claim 1 further comprising means for removing the control signal when the switch temperature exceeds a second set temperature that is higher than the first set temperature.

3. A method for thermally managing an electronic switch that provides power to a load, comprising the steps of:

providing a pulse width modulated control signal to an electronic switch, the electronic switch providing power to a load responsive to the control signal;

monitoring a switch temperature of the electronic switch to determine whether the switch temperature is below a first set temperature; and modifying the control signal such that an average power dissipated by the electronic switch is reduced when the switch temperature exceeds the first set temperature, wherein the control signal is modified by increasing a slew rate of the control signal when the switch temperature exceeds the first set temperature.

4. The method of claim 3, further including the step of:

removing the control signal when the switch temperature exceeds a second set temperature that is higher than the first set temperature.

* * * * *